United States Patent
Dominguez et al.

(10) Patent No.: US 10,497,669 B2
(45) Date of Patent: Dec. 3, 2019

(54) HYBRID DIE STACKING

(71) Applicant: Intel Corporation, Santa Clara, CA (US)

(72) Inventors: Juan Eduardo Dominguez, Gilbert, AZ (US); Hyoung Il Kim, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 230 days.

(21) Appl. No.: 15/386,780

(22) Filed: Dec. 21, 2016

(65) Prior Publication Data
US 2018/0175000 A1 Jun. 21, 2018

(51) Int. Cl.
H01L 23/31 (2006.01)
H01L 25/065 (2006.01)
H01L 25/00 (2006.01)

(52) U.S. Cl.
CPC ...... *H01L 25/0652* (2013.01); *H01L 25/0657* (2013.01); *H01L 25/50* (2013.01); *H01L 2224/16145* (2013.01); *H01L 2224/48091* (2013.01); *H01L 2224/48137* (2013.01); *H01L 2224/48145* (2013.01); *H01L 2225/0651* (2013.01); *H01L 2225/06506* (2013.01); *H01L 2225/06541* (2013.01);
(Continued)

(58) Field of Classification Search
CPC ..... H01L 25/50; H01L 25/00; H01L 25/0652; H01L 25/0657; H01L 25/065; H01L 23/00; H01L 23/31; H01L 23/29; H01L 23/552; H01L 23/3121; H01L 23/28; H01L 23/48; H01L 23/52; H01L 23/495; H01L 24/29; H01L 24/49; H01L 24/73; H01L 24/83; H01L 24/85; H01L 24/91; H01L 2224/16145; H01L 2224/48091; H01L 2224/48137; H01L 2224/48145; H01L 2225/06506; H01L 2225/0651; H01L 2225/06541; H01L 2225/06444; H01L 2225/06562; H01L 2225/06589
USPC .......................................... 257/621
See application file for complete search history.

(56) References Cited

U.S. PATENT DOCUMENTS

2002/0121679 A1   9/2002  Bazarjani et al.
2003/0102569 A1*  6/2003  Reyes ............... H01L 24/49
                                              257/777
2011/0108972 A1   5/2011  Foster, Sr. et al.
(Continued)

FOREIGN PATENT DOCUMENTS

WO        2014163687        10/2014

OTHER PUBLICATIONS

"International Application Serial No. PCT US2017 062823, International Search Report dated Feb. 23, 2018", 4 pgs.
(Continued)

Primary Examiner — Chuong A Luu
(74) Attorney, Agent, or Firm — Schwegman Lundberg & Woessner, P.A.

(57) ABSTRACT

Disclosed is a die stack. The die stack may include a first plurality of dies and a second plurality of dies. Each of the plurality of dies may define a plurality of vias passing from a first side to a second side of the die. The plurality of dies may be stacked such that each of the plurality of vias in a first die are collinear with a respective via in a second die. At least one of the second plurality of dies may be wire bonded to at least one of the first plurality of dies.

19 Claims, 3 Drawing Sheets

(52) U.S. Cl.
CPC ............... *H01L 2225/06544* (2013.01); *H01L 2225/06562* (2013.01); *H01L 2225/06589* (2013.01)

(56) References Cited

U.S. PATENT DOCUMENTS

2011/0278737 A1    11/2011  Yazdani
2015/0108656 A1*  4/2015  Juneja .................... H01L 24/48
                                                                   257/774
2016/0357630 A1    12/2016  Kang et al.

OTHER PUBLICATIONS

"International Application Serial No. PCT US2017 062823, Written Opinion dated Feb. 23, 2018", 9 pgs.

* cited by examiner

HYBRID DIE STACKING

TECHNICAL FIELD

Embodiments described generally herein relate to microelectronic packages. More particularly, embodiments described generally herein relate to die stacks of the microelectronic packages.

BACKGROUND

Microelectronics generally include a central processing unit (CPU). In order to enhance performance, CPU products are increasingly integrating multiple dies within the CPU package in a side-by-side or other multi-chip module (MCM) format.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

High signal integrity in stacked dies may require use of through silicon vias (TSV). Through silicon vias are expensive and may not be necessary for all applications. As disclosed herein, combinations of TSVs with wirebond connections within or between die stacks may be used to reduce costs and complexity of microelectronics packages.

As disclosed herein, the integration of wirebond and TSV may be accomplished on the same die so that certain signals, for example, signals that may require less signal integrity, can be transmitted using wirebonds, rather than expensive TSVs. Signal that may require greater signal integrity may utilize TSVs as needed. The various configurations disclosed herein may allow for a reduction in process steps, number of dies that require TSV, and thus may lower costs and integration concerns.

As disclosed herein, a first die stack may include TSVs for various signals that may require higher signal integrity and a second die stack may not have TSVs and may be used for signals that do not require high signal integrity. One of more of the dies within the first die stack may be wirebonded to one or more of the dies within the second die stack to allow power delivery and signal transmissions between the die stacks. The first die stack and the second die stack may be stacked on top of each other or located adjacent to one another. As a result, a vertical height of the overall package may be reduced. In addition, insulating layers may be located in between the first die stack and the second die stack to help with thermal management of the package.

The various configurations disclosed herein may be used in applications such as, but not limited to, use of different memory types, without having to implement TSV in all memories dies) and only in memories with signal integrity requirement. For example, DRAM or ASIC in may be used in conjunction with TSV stacks without having to add TSV on all of the dies. In addition, the same memory type dies, may be used with effective use of TSV advantages on portion of the stack, while the less effective portion of the stack may not utilize TSVs to reduce the cost. Furthermore, the wirebond also may be used to connect to appropriate components (i.e., passive, etc.) which may help to boost or control signals.

Figure 1:
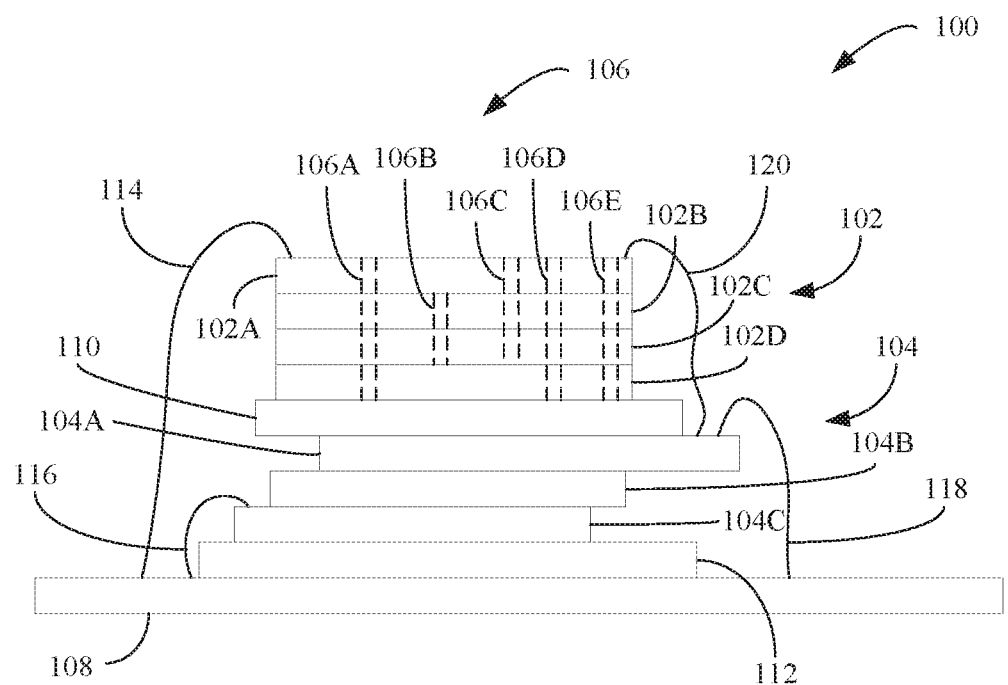
FIG. 1 illustrates a die stack in accordance with some embodiments disclosed herein.

Turning now to the figures, FIG. 1 illustrates a microelectronics package 100. The microelectronic package 100 can include a first die stack 102, a second die stack 104, a thermal insulator 112, and a substrate 108. As shown in FIG. 1, the first die stack 102 may include any number of dies (e.g., die 102A, 102B, 102C, and 102D) and the second die stack 104 may include any number of dies (e.g., 104A, 104B, and 104C).

The first die stack 102 may include a plurality of vias 106. Each of the vias 106 may pass through one or more of the dies within the first die stack 102. The vias 106 may be through silicon vias. The vias 106 may be utilized to transmit signals that may require greater signal integrity such as, but not limited to, signal frequency (e.g., high frequency signals), etc. The vias 106 may be formed using dry etching, wet etching, drilling processes, etc. and filling the voids created in the die with a conductive material such as copper, aluminum, gold, nickel, etc.

During a fabrication process, various dies having TSVs may be stacked upon one another so that one or more of the TSVs corresponds with a TSV in another die. For example, as shown in FIG. 1, a first TSV 106A, a fourth TSV 106D, and a fifth TSV 106E may pass through each of the dies within the first die stack 102. A second TSV 106E may pass through die 102B and die 102C. A third TSV 106C may pass through die 102A, die 102B, and die 102C.

The second die stack 104 may or may not contain dies that include TSVs. For example, and as shown in FIG. 1, the second die stack 104 may include a first die 104A, a second die 104B, and a third die 104C, each of which do not include a TSV. As a result, the second die stack 104 may be used to process and transmit signals that require less signal integrity. Because the second die stack 104 does not include TSVs, the second die stack 104 may be easier and less expensive to fabricate.

As shown in FIG. 1, the first die stack 102 may be stacked upon the second die stack 104. A thermal insulator 110 may be located in between the first die stack 102 and the second die stack 104. The thermal insulator 110 may be made of the same or a different material than the thermal insulator 112. The thermal insulators 112 and 110 may or not be utilized. For example, to minimize a vertical height of the microelectronics package 100, the thermal insulators 112 and 110 may be omitted. As such, the second die stack 104 may be directly attached to the substrate 108.

The first die stack 102 may be wirebonded to the second die stack 104, via wirebond 120. In addition, the first die stack 102 may be wirebonded to the substrate 108 via wirebond 114. The second die stack 104 may be wirebonded to the substrate 108 via wirebonds 116 and 118. As such, power and signals may directly pass from the first die stack 102 to the second die stack 104. In addition, power and signals may directly pass from the first die stack 102 and the second die stack 104 and the substrate 108. The substrate 108 may be an organic substrate or part of an interposer.

Figure 2:
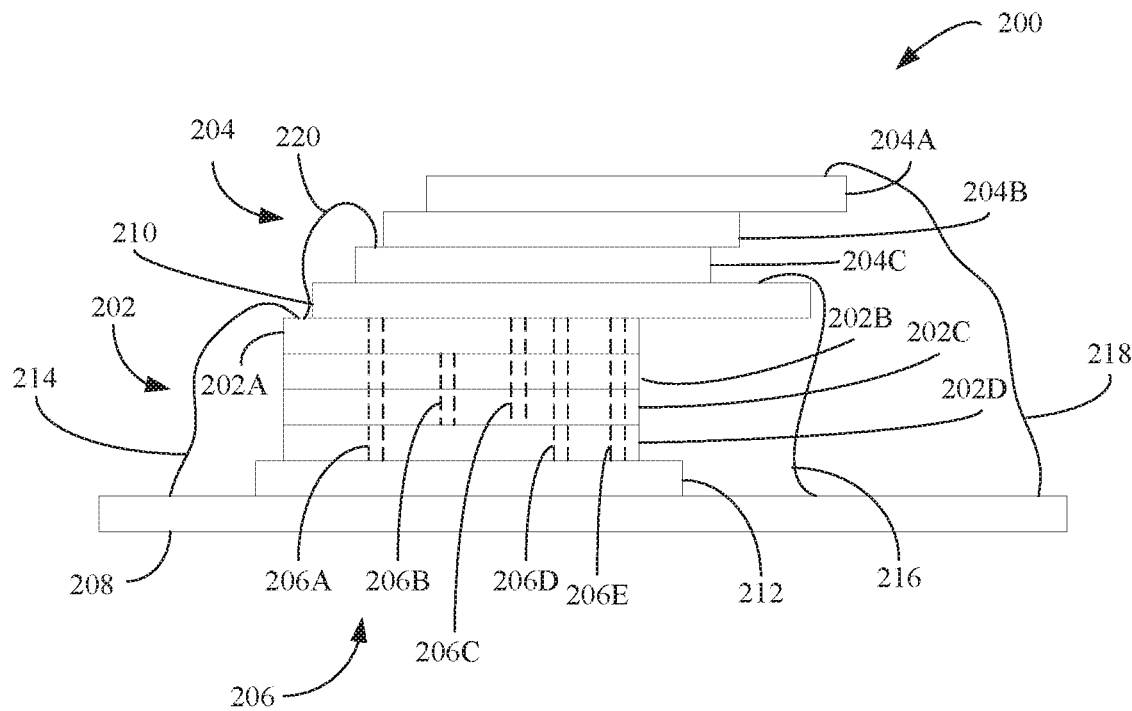
FIG. 2 illustrates a die stack in accordance with some embodiments disclosed herein.

FIG. 2 illustrates a microelectronics package 200. The microelectronic package 200 can include a first die stack 202, a second die stack 204, a thermal insulator 212, and a substrate 208. The first die stack 202 may include any number of dies (e.g., die 202A, 202B, 202C, and 202D) and the second die stack 204 may include any number of dies (e.g., 204A, 204B, and 204C).

The first die stack 202 may include a plurality of vias 206. Each of the vias 206 may pass through one or more of the dies within the first die stack 202. The vias 206 may be through silicon vias. As with the vias 106, the vias 206 may be utilized to transmit signals that may require greater signal integrity such as, but not limited to, signal frequency (e.g., high frequency signals), etc. The vias 106 may be formed using dry etching, wet etching, drilling processes, etc. and filling the voids created in the die with a conductive material such as copper, aluminum, gold, nickel, etc.

During a fabrication process, various dies having TSVs may be stacked upon one another so that one or more of the TSVs corresponds with a TSV in another die. For example, a first TSV 206A, a fourth TSV 206D, and a fifth TSV 206E may pass through each of the dies within the first die stack 202. A second TSV 206B may pass through die 202B and die 202C. A third TSV 206C may pass through die 202A, die 202B, and die 202C.

The second die stack 204 may or may not contain dies that include TSVs. For example, and as shown in FIG. 2, the second die stack 204 may include a first die 204A, a second die 204B, and a third die 204C, each of which do not include a TSV. As a result, the second die stack 204 may be used to process and transmit signals that require less signal integrity. Because the second die stack 204 does not include TSVs, the second die stack 204 may be easier and less expensive to fabricate.

As shown in FIG. 2, the second die stack 204 may be stacked upon the first die stack 202. A thermal insulator 210 may be located in between the first die stack 202 and the second die stack 204. The thermal insulator 210 may be made of the same or a different material than the thermal insulator 212. The thermal insulators 210 and 212 may or not be utilized. For example, to minimize a vertical height of the microelectronics package 200, the thermal insulators 210 and 210 may be omitted. As such, the first die stack 202 may be directly attached to the substrate 208.

The first die stack 202 may be wirebonded to the second die stack 204 via wirebond 220. In addition, the first die stack 202 may be wirebonded to the substrate 208 via wirebond 214. The second die stack 204 may be wirebonded to the substrate 208 via wirebonds 216 and 218. As such, power and signals may directly pass from the first die stack 202 to the second die stack 204. In addition, power and signals may directly pass from the first die stack 202 and the second die stack 204 and the substrate 208. The substrate 208 may be an organic substrate or part of an interposer.

Figure 3:
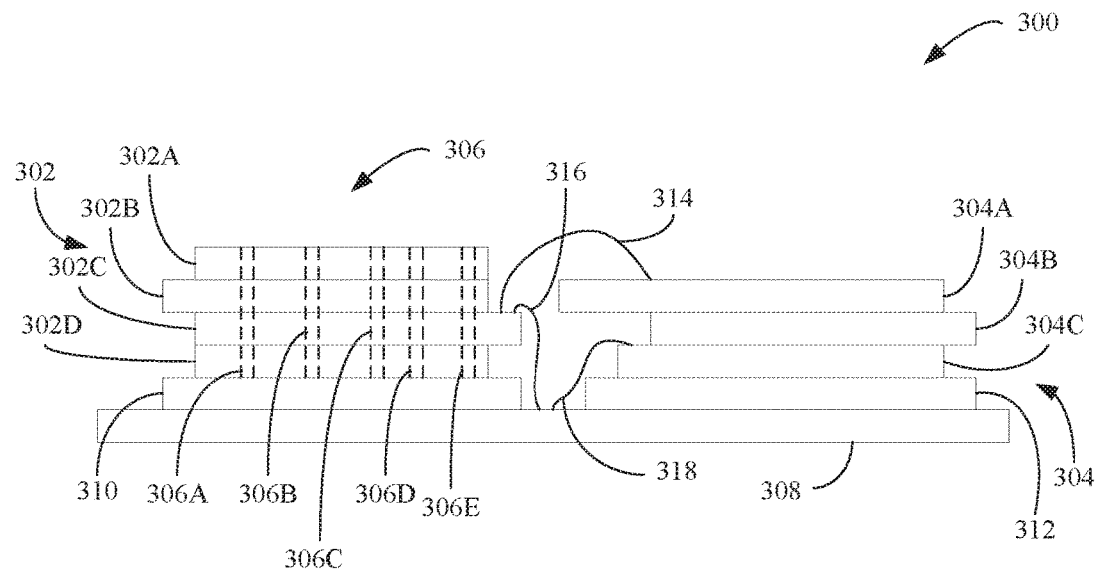
FIG. 3 illustrates a die stack in accordance with some embodiments disclosed herein.

FIG. 3 illustrates a microelectronics package 300. The microelectronic package 300 can include a first die stack 302, a second die stack 304, a thermal insulator 312, and a substrate 308. The first die stack 302 may include any number of dies (e.g., die 302A, 302B, 302C, and 302D) and the second die stack 304 may include any number of dies (e.g., 304A, 304B, and 304C).

The first die stack 302 may include a plurality of vias 306. Each of the vias 306 may pass through one or more of the dies within the first die stack 302. The vias 306 may be through silicon vias. As with the vias 106 and 206, the vias 306 may be utilized to transmit signals that may require greater signal integrity such as, but not limited to, signal frequency (e.g., high frequency signals), etc. The vias 306 may be formed using dry etching, wet etching, drilling processes, etc. and filling the voids created in the die with a conductive material such as copper, aluminum, gold, nickel, etc.

During a fabrication process, various dies having TSVs may be stacked upon one another so that one or more of the TSVs corresponds with a TSV in another die. For example, a first TSV 306A, a fourth TSV 306D, and a fifth TSV 306E may pass through each of the dies 306 within the first die stack 302. A second TSV 306B may pass through die 302B and die 302C. A third TSV 306C may pass through die 302A, die 302B, and die 302C.

The second die stack 304 may or may not contain dies that include TSVs. For example, and as shown in FIG. 3, the second die stack 304 may include a first die 304A, a second die 304B, and a third die 304C, each of which do not include a TSV. As a result, the second die stack 304 may be used to process and transmit signals that require less signal integrity. Because the second die stack 304 does not include TSVs, the second die stack 304 may be easier and less expensive to fabricate.

As shown in FIG. 3, the first die stack 302 and the second die stack 304 may be located adjacent to one another. A thermal insulator 310 may be located in between the first die stack 202 and the substrate 308. A thermal insulator 312 may be located in between the second die stack 304 and the substrate 308. The thermal insulator 310 may be made of the same or a different material than the thermal insulator 312. The thermal insulators 310 and 312 may or not be utilized. For example, to minimize a vertical height of the microelectronics package 300, the thermal insulator 310 may be utilized and the thermal insulator 312 may be utilized and visa versa. As such, the first die stack 302 may be attached to the thermal insulator 310 and the second die stack 304 may be directly attached to the substrate 308.

The first die stack 302 may be wirebonded to the second die stack 304 via wirebond 314. In addition, the first die stack 302 may be wirebonded to the substrate 308 via wirebond 316. The second die stack 304 may be wirebonded to the substrate 308 via wirebonds 318. As such, power and signals may directly pass from the first die stack 302 to the second die stack 304. In addition, power and signals may directly pass from the first die stack 302 and the second die stack 304 and the substrate 308. The substrate 308 may be an organic substrate or part of an interposer.

Figure 4:
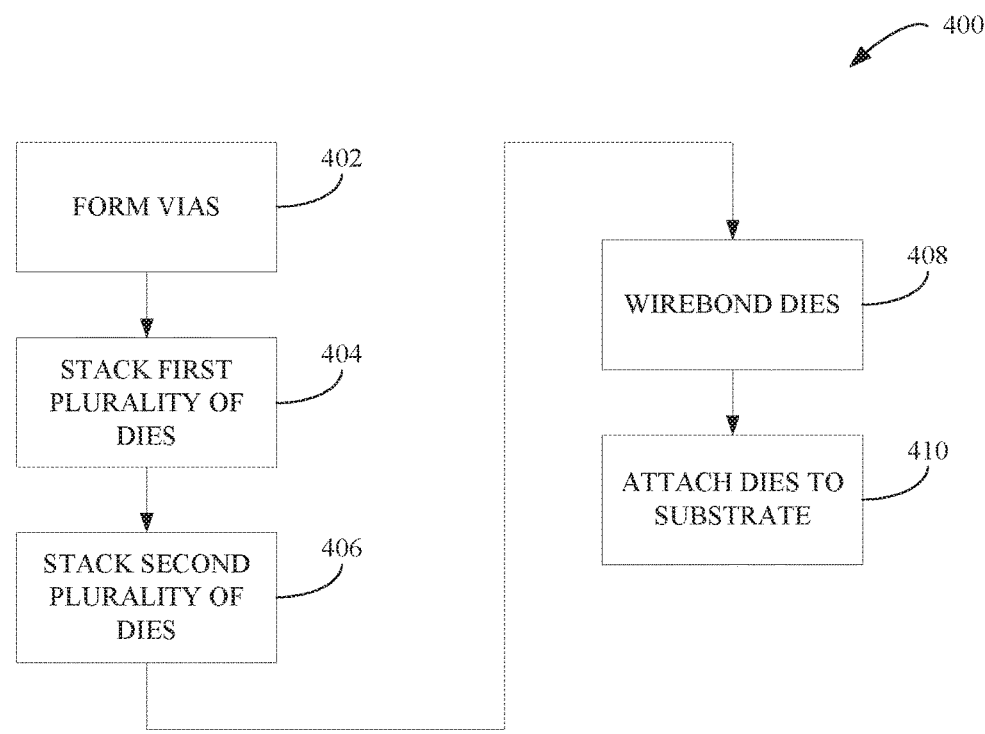
FIG. 4 illustrates a method in accordance with some embodiments disclosed herein.

FIG. 4 illustrates a method 400 for manufacturing a die stack, such as those associated with microelectronics packages 100, 200, and 300. The method 400 may begin at stage 402 where a plurality of vias may be formed in a first plurality of dies. As disclosed herein, the vias may be formed through multiple dies, one or more subsets of the first plurality of dies, etc. via wet etching, dry etching, etc.

From stage 402, the method 400 may proceed to stage 404 where the first plurality of dies may be stacked. For example, as disclosed above, the first plurality of dies may be stacked such that each of the plurality of vias in a first die are collinear with a respective via in a second die. Stated another way, each of the dies may be stacked so that various vias form an electrically conductive path through one or more of the first plurality of dies.

From stage 404, the method 400 may proceed to stage 406 where a second plurality of dies may be stacked. As disclosed herein, the second plurality of dies may or may not contain vias. In addition, the second plurality of dies may be stacked without regard to via location. For example, when the second plurality of dies do not contain vias, the various dies within the second plurality of dies may be stacked in any configuration because vias will not need to be aligned.

From stage 406, the method 400 may proceed to stage 408 where at least one of the first plurality of dies may be wirebonded to at least one of the second plurality of dies or a substrate. For instance, one of the first plurality of dies may be wirebonded to a substrate and a second one of the first plurality of dies may be wirebonded to one of the second plurality of dies. A second one of the plurality of dies may be wirebonded to the substrate as well.

From stage 408, the method 400 may proceed to stage 410 where the first plurality of dies and the second plurality of dies may be attached to the substrate. For example, as disclosed herein, the first plurality of dies may be attached to the substrate and the second plurality of dies may be stacked on top of the first plurality of dies. In addition, the second plurality of dies may be attached to the substrate and the first plurality of dies may be stacked on top of the second plurality of dies. Furthermore, both the first plurality of dies and the second plurality of dies may be attached to the substrate. Moreover, as disclosed herein, a thermal insulator may be located in between the first plurality of dies and the substrate, the second plurality of dies and the substrate, or the first plurality of dies and the second plurality of dies.

Figure 5:
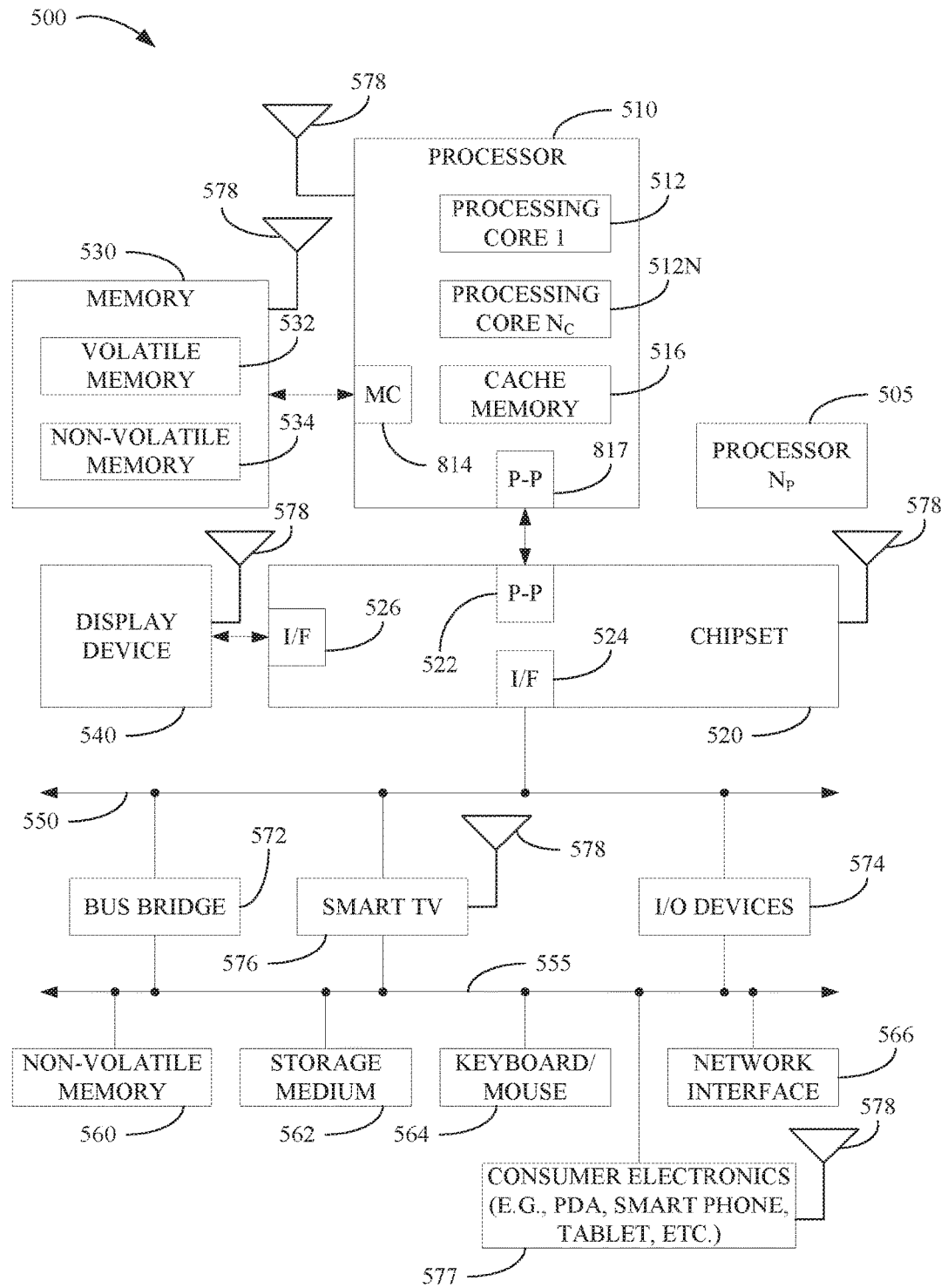
FIG. 5 illustrates a system level diagram in accordance with some embodiments disclosed herein.

FIG. 5 illustrates a system level diagram, according to one embodiment. For instance, FIG. 5 depicts an example of an electronic device (e.g., system) including the microelectronics package 100 as described herein with reference to FIGS. 1-3. FIG. 5 is included to show an example of a higher level device application. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 500 is a system on a chip (SOC) system. As such, the various embodiments disclosed herein may be used in memory components, CPU components, etc. of the system 500.

In one embodiment, processor 510 has one or more processing cores 512 and $512N_c$, where $512N_c$ represents the Nth processor core inside processor 510 where $N_c$ is a positive integer. In one embodiment, system 500 includes multiple processors including 510 and 505, where processor 505 has logic similar or identical to the logic of processor 510. In some embodiments, processing core 512 includes, but is not limited to, pre-fetch logic to fetch instructions, decode logic to decode the instructions, execution logic to execute instructions, and the like. In some embodiments, processor 510 has a cache memory 516 to cache instructions and/or data for system 500. Cache memory 516 may be organized into a hierarchical structure including one or more levels of cache memory.

In some embodiments, processor 510 includes a memory controller 514, which is operable to perform functions that enable the processor 510 to access and communicate with memory 530 that includes a volatile memory 532 and/or a non-volatile memory 534. In some embodiments, processor 510 is coupled with memory 530 and chipset 520. Processor 510 may also be coupled to an antenna 578 to communicate with any device configured to transmit and/or receive wireless signals. In one embodiment, the antenna interface 578 operates in accordance with, but is not limited to, the IEEE 802.11 standard and its related family, Home Plug AV (HPAV), Ultra Wide Band (UWB) Bluetooth, WiMax, or any form of wireless communication protocol.

In some embodiments, volatile memory 532 includes, but is not limited to, Synchronous Dynamic Random Access Memory (SDRAM), Dynamic Random Access Memory (DRAM), Rambus Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device. The die stacks disclosed in FIGS. 1-3 may be used to implement the volatile memory 532.

Memory 530 stores information and instructions to be executed by processor 510. In one embodiment, memory 530 may also store temporary variables or other intermediate information while processor 510 is executing instructions. In the illustrated embodiment, chipset 520 connects with processor 510 via. Point-to-Point (PtP or P-P) interfaces 517 and 522. Chipset 520 enables processor 510 to connect to other elements in system 500. In some embodiments, interfaces 517 and 522 operate in accordance with a PtP communication protocol such as the Intel® QuickPath Interconnect (QPI) or the like. In other embodiments, a different interconnect may be used.

In some embodiments, chipset 520 is operable to communicate with processor 510, 505, display device 540, and other devices 572, 576, 574, 560, 562, 564, 566, 577, etc. Chipset 520 may also be coupled to an antenna 578 to communicate with any device configured to transmit and/or receive wireless signals.

Chipset 520 connects to display device 540 via interface (I/F) 526. Display 540 may be, for example, a liquid crystal display (LCD), a plasma display, cathode ray tube (CRT) display, or any other form of visual display device. In some embodiments, processor 510 and chipset 520 are merged into a single SOC. In addition, chipset 520 connects to one or more buses 550 and 555 that interconnect various elements 574, 560, 562, 564, and 566. Buses 550 and 555 may be interconnected together via a bus bridge 572. In one embodiment, chipset 520 couples with a non-volatile memory 560, a mass storage device(s) 562, a keyboard/mouse 564, a network interface 566, smart TV 576, consumer electronics 577, etc., via interface 524.

In one embodiment, mass storage device 562 includes, but is not limited to, a solid state drive, a hard disk drive, a universal serial bus flash memory drive, or any other form of computer data storage medium. In one embodiment, network interface 566 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into processor core 512.

ADDITIONAL NOTES & EXAMPLES

Example 1 is a die stack comprising: a first plurality of dies, each of the plurality of dies defining a plurality of vias passing from a first side to a second side of the die, the plurality of dies stacked such that each of the plurality of vias in a first die are collinear with a respective via in a second die; and a second plurality of dies arranged without regard to via location, at least one of the second plurality of dies wire bonded to at least one of the first plurality of dies.

In Example 2, the subject matter of Example 1 optionally includes wherein the first plurality of dies are stacked on top of the second plurality of dies.

In Example 3, the subject matter of any one or more of Examples 1-2 optionally include wherein the second plurality of dies are stacked on top of the first plurality of dies.

In Example 4, the subject matter of any one or more of Examples 1-3 optionally include wherein the first plurality of dies are located adjacent the second plurality of dies.

In Example 5, the subject matter of any one or more of Examples 1-4 optionally include wherein the second plurality of dies are attached to a substrate.

In Example 6, the subject matter of any one or more of Examples 1-5 optionally include wherein the first plurality of dies are attached to a substrate.

In Example 7, the subject matter of any one or more of Examples 5-6 optionally include wherein the substrate is an organic substrate.

In Example 8, the subject matter of any one or more of Examples 1-7 optionally include wherein the at least one of the second plurality of dies wire bonded to the at least one of the first plurality of dies includes an interposer electrically coupling the at least one of the second plurality of dies and the at least one of the first plurality of dies.

In Example 9, the subject matter of any one or more of Examples 1-8 optionally include a thermal insulator located in between the first plurality of dies and the second plurality of dies.

In Example 10, the subject matter of any one or more of Examples 1-9 optionally include a thermal insulator located in between a substrate and at least one of the first plurality of dies and the second plurality of dies.

In Example 11, the subject matter of any one or more of Examples 1-10 optionally include wherein the second plurality of dies are arranged in an offset relationship to one another.

In Example 12, the subject matter of any one or more of Examples 1-11 optionally include wherein the die stack is a component of a memory board, a motherboard, a graphics card, or a video card.

Example 13 is a microelectronics package comprising: a substrate; a first plurality of dies, each of the plurality of dies defining a plurality of vias passing from a first side to a second side of the die, the plurality of dies stacked such that each of the plurality of vias in a first die are collinear with a respective via in a second die; and a second plurality of dies arranged without regard to via location, at least one of the second plurality of dies wire bonded to at least one of the first plurality of dies, wherein either the first plurality of dies or the second plurality of dies is attached to the substrate.

In Example 14, the subject matter of Example 13 optionally includes when the second plurality of dies is attached to the substrate, the first plurality of dies are stacked on top of the second plurality of dies.

In Example 15, the subject matter of any one or more of Examples 13-14 optionally include when the first plurality of dies is attached to the substrate, the second plurality of dies are stacked on top of the first plurality of dies.

In Example 16, the subject matter of any one or more of Examples 13-15 optionally include wherein the first plurality of dies are located adjacent the second plurality of dies and both the first plurality of dies and the second plurality of dies are attached to the substrate.

In Example 17, the subject matter of any one or more of Examples 13-16 optionally include wherein the substrate is an organic substrate.

In Example 18, the subject matter of any one or more of Examples 13-17 optionally include wherein the at least one of the second plurality of dies wire bonded to the at least one of the first plurality of dies includes an interposer electrically coupling the at least one of the second plurality of dies and the at least one of the first plurality of dies.

In Example 19, the subject matter of any one or more of Examples 13-18 optionally include a thermal insulator located in between the first plurality of dies and the second plurality of dies.

In Example 20, the subject matter of any one or more of Examples 13-19 optionally include a thermal insulator located in between a substrate and at least one of the first plurality of dies or the second plurality of dies.

In Example 21, the subject matter of any one or more of Examples 13-20 optionally include wherein the second plurality of dies are arranged in an offset relationship to one another.

In Example 22, the subject matter of any one or more of Examples 13-21 optionally include wherein the die stack is a component of a memory board, a motherboard, a graphics card, or a video card.

Example 23 is a method of manufacturing a die stack, the method comprising: stacking a first plurality of dies, each of the first plurality of dies defining a plurality of vias passing from a first side of a die to a second side of a die, the plurality of dies stacked such that each of the plurality of vias in a first die are collinear with a respective via in a second die; stacking a second plurality of dies, each of the second plurality of dies stacked without regard to via location; and wirebonding at least one of the first plurality of dies to at least one of the second plurality of dies.

In Example 24, the subject matter of Example 23 optionally includes forming the plurality of vias in each of the first plurality of dies.

In Example 25, the subject matter of any one or more of Examples 23-24 optionally include wherein the second plurality of does do not define vias.

In Example 26, the subject matter of any one or more of Examples 23-25 optionally include stacking the first plurality of dies on top of the second plurality of dies.

In Example 27, the subject matter of any one or more of Examples 23-26 optionally include stacking the second plurality of dies on top of the first plurality of dies.

In Example 28, the subject matter of any one or more of Examples 26-27 optionally include locating an insulating layer in between the first plurality of dies and the second plurality of dies.

In Example 29, the subject matter of any one or more of Examples 23-28 optionally include attaching the first plurality of dies to a substrate.

In Example 30, the subject matter of any one or more of Examples 23-29 optionally include attaching the second plurality of dies to a substrate.

In Example 31, the subject matter of any one or more of Examples 29-30 optionally include locating an insulating layer in between the first plurality of dies or the second plurality of dies and the substrate.

In Example 32, the subject matter of any one or more of Examples 23-31 optionally include attaching both the plurality of dies to a substrate.

In Example 33, the subject matter of any one or more of Examples 23-32 optionally include wherein stacking the second plurality of dies includes stacking the second plurality of dies in an offset relationship to one another.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplate are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. However, the claims may not set forth features disclosed herein because embodiments may include a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

The invention claimed is:

1. A die stack comprising:
   a first plurality of dies, wherein each of the plurality of dies define a plurality of vias that pass from a first side to a second side of the die, the plurality of dies stacked such that each of the plurality of vias in a first die is collinear with a respective via in a second die; and
   a second plurality of dies arranged without regard to via location, at least one of the second plurality of dies directly wire bonded to at least one of the first plurality of dies, the at least one of the first plurality of dies and the at least one of the second plurality of dies each directly wire bonded to a substrate.

2. The die stack of claim 1, wherein the first plurality of dies are stacked on top of the second plurality of dies.

3. The die stack of claim 1, wherein the second plurality of dies are stacked on top of the first plurality of dies.

4. The die stack of claim 1, wherein the first plurality of dies are located adjacent the second plurality of dies.

5. The die stack of claim 1, wherein the second plurality of dies are attached to the substrate.

6. The die stack of claim 1, wherein the first plurality of dies are attached to the substrate.

7. The die stack of claim 1, wherein the at least one of the second plurality of dies wire bonded to the at least one of the first plurality of dies includes an interposer that electrically couples the at least one of the second plurality of dies and the at least one of the first plurality of dies.

8. The die stack of claim 1, further comprising a thermal insulator located in between the first plurality of dies and the second plurality of dies.

9. The die stack of claim 1, further comprising a thermal insulator located in between the substrate and at least one of the first plurality of dies and the second plurality of dies.

10. The die stack of claim 1, wherein the die stack is a component of a memory board, a motherboard, a graphics card, or a video card.

11. A microelectronics package comprising:
    a substrate;
    a first plurality of dies, wherein each of the plurality of dies define a plurality of vias that pass from a first side to a second side of the die, the plurality of dies stacked such that each of the plurality of vias in a first die are collinear with a respective via in a second die; and
    a second plurality of dies arranged without regard to via location, at least one of the second plurality of dies wire directly bonded to at least one of the first plurality of dies,
    wherein either the first plurality of dies or the second plurality of dies is attached to the substrate and the at least one of the first plurality of dies and the at least one of the second plurality of dies each directly wire bonded to a substrate.

12. The microelectronics package of claim 11, when the second plurality of dies is attached to the substrate, the first plurality of dies are stacked on top of the second plurality of dies.

13. The microelectronics package of claim 11, when the first plurality of dies is attached to the substrate, the second plurality of dies are stacked on top of the first plurality of dies.

14. The microelectronics package of claim 11, wherein the first plurality of dies are located adjacent the second plurality of dies and both the first plurality of dies and the second plurality of dies are attached to the substrate.

15. The microelectronics package of claim 11, wherein the at least one of the second plurality of dies wire bonded to the at least one of the first plurality of dies includes an interposer that electrically couples the at least one of the second plurality of dies and the at least one of the first plurality of dies.

16. The microelectronics package of claim 11, further comprising a thermal insulator located in between the first plurality of dies and the second plurality of dies.

17. The microelectronics package of claim 11, further comprising a thermal insulator located in between a substrate and at least one of the first plurality of dies or the second plurality of dies.

18. The microelectronics package of claim 11, wherein the die stack is a component of a memory hoard, a motherboard, a graphics card, or a video card.

19. The microelectronics package of claim 11, wherein the second plurality of dies are arranged in an offset relationship to one another.

* * * * *

UNITED STATES PATENT AND TRADEMARK OFFICE
CERTIFICATE OF CORRECTION

PATENT NO. : 10,497,669 B2
APPLICATION NO. : 15/386780
DATED : December 3, 2019
INVENTOR(S) : Dominguez et al.

Page 1 of 1

It is certified that error appears in the above-identified patent and that said Letters Patent is hereby corrected as shown below:

In the Claims

Column 11, Line 17, Claim 18, delete "hoard," and insert --board,-- therefor

Signed and Sealed this
Seventh Day of July, 2020

Andrei Iancu
*Director of the United States Patent and Trademark Office*